United States Patent
Kim et al.

(10) Patent No.: US 7,534,698 B2
(45) Date of Patent: May 19, 2009

(54) METHODS OF FORMING SEMICONDUCTOR DEVICES HAVING MULTILAYER ISOLATION STRUCTURES

(75) Inventors: Hong-Gun Kim, Gyeonggi-do (KR); Eunkee Hong, Gyeonggi-do (KR); Kyu-Tae Na, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 499 days.

(21) Appl. No.: 11/209,879

(22) Filed: Aug. 23, 2005

(65) Prior Publication Data
US 2006/0054989 A1  Mar. 16, 2006

(30) Foreign Application Priority Data
Aug. 24, 2004  (KR) .................. 10-2004-0066589

(51) Int. Cl.
*H01L 21/76* (2006.01)
(52) U.S. Cl. .................. 438/437; 438/424; 438/435
(58) Field of Classification Search .................. 438/424, 438/435, 437
See application file for complete search history.

(56) References Cited

U.S. PATENT DOCUMENTS

2003/0104126 A1  6/2003  Fang et al. ............ 427/255.392
2003/0235961 A1  12/2003  Metzner et al. ............. 438/287

FOREIGN PATENT DOCUMENTS

KR  10-2001-0007431 A  1/2001

*Primary Examiner*—Long Pham
(74) *Attorney, Agent, or Firm*—Myers Bigel Sibley & Sajovec

(57) ABSTRACT

A semiconductor device includes a first structure having a recess having a bottom and opposing side surfaces, and a second structure conformally disposed on the bottom and side surfaces of the recess. The second structure includes a multilayer having two layers having a thickness substantially smaller than a width of the recess. Methods of manufacturing a semiconductor device include providing a first structure having a recess in a deposition chamber and flowing first and second reactants over the first structure for a first period at first and second flow rates. Then, the flow rates of the first second reactants to the first structure are substantially reduced for a pause period. The first and second reactants are then flowed over the first structure for a second period at third and fourth flow rates. The deposition and pause steps may be repeated until a multilayer having a desired thickness is formed.

28 Claims, 15 Drawing Sheets

METHODS OF FORMING SEMICONDUCTOR DEVICES HAVING MULTILAYER ISOLATION STRUCTURES

CROSS-REFERENCE TO RELATED APPLICATION

This application claims priority under 35 USC §119 to Korean Patent Application No. 2004-66589 filed on Aug. 24, 2004 the contents of which are incorporated herein by reference in their entirety.

FIELD OF THE INVENTION

The present invention relates to semiconductor devices and methods of forming semiconductor devices. In particular, the present invention relates to semiconductor devices having isolation structures and methods of forming semiconductor devices having isolation structures.

BACKGROUND

As semiconductor devices become more highly integrated and are required to operate at higher speeds, it may be desirable to form finer patterns in a semiconductor substrate and to reduce the spacing between patterns in a semiconductor substrate. Accordingly, a great deal of emphasis has been placed on developing the technology for filling up the intervals between patterns on a semiconductor substrate with isolation structures that have reduced defects such as voids and/or seams.

Examples of structures in semiconductor devices which may be used to fill the space between patterns include a trench device isolation layer, a sacrificial layer for separating nodes of a lower electrode of a cylindrical capacitor, an insulation interlayer between gate patterns, etc. Some of these structures such as the trench device isolation layer, the sacrificial layer or the insulation interlayer may include a silicon oxide formed using a chemical vapor deposition (CVD) process.

However, CVD-deposited silicon oxide may have the problem of poor step coverage. That is, when a recess having an aspect ratio (i.e., ratio of height to width) of, for example, over about three, is filled with CVD-deposited silicon oxide, an overhang may be generated at an upper portion of the recess. Layer defects such as voids and/or seams may be created in the silicon oxide layer due to such an overhang.

SUMMARY

Some embodiments of the invention provide a semiconductor device including a first structure including a recess therein having at least a bottom and opposing side surfaces, and a second structure conformally disposed on the bottom and the side surfaces of the recess. The second structure includes a multilayer structure having at least two layers, each having a thickness substantially smaller than a width of the recess. The multilayer structure may comprise a dielectric material.

In some embodiments of the invention, the first reactant may be provided at a flow rate of between about 100 sccm and about 3000 sccm and the second reactant may be provided at a flow rate of about 6000 sccm to about 20,000 sccm. In some embodiments of the invention, the first reactant and the second reactant are provided in the deposition chamber for a time of about 200 seconds to about 250 seconds.

In some embodiments of the invention, respective ones of the thin layers of the multilayer structure may have substantially the same thickness. In further embodiments of the invention, the thin layers of the multilayer structure may include a first layer having a first thickness and a second layer formed on the first layer and having a second thickness that is greater than the first thickness.

The second structure may include a silicon oxide layer. In some embodiments of the invention, the silicon oxide layer may have an etch rate of about 80 Å/min when etched with an aqueous HF solution of about 0.5% in water. Furthermore, the silicon oxide layer may have a thermal reduction rate less than about 4%.

Methods of manufacturing semiconductor devices according to some embodiments of the invention include providing a first structure having a recess therein in a deposition chamber and flowing a first reactant and a second reactant over the first structure for a first deposition period at respective first and second flow rates to thereby deposit a first thin layer of a material in the recess. After the first deposition period, the flow rates of the first reactant and the second reactant to the first structure are substantially reduced for a pause period The first reactant and the second reactant are then flowed over the first structure for a second deposition period at respective third and fourth flow rates to thereby deposit a second thin layer of material.

In some embodiments of the invention, substantially reducing the flow of the first and second reactants includes stopping the flow of the first and second reactants. In further embodiments of the invention, flowing the first and second reactants includes depositing a thin layer, and the method further includes performing the steps of sequentially depositing a thin layer and substantially reducing the flow of the first and second reactants at least twice.

In some embodiments of the invention, the flow rate of the first reactant may be increased during at least one deposition step, and the flow rate of the second reactant is substantially constant during the at least one deposition step. Further, the flow rate of the second reactant during the deposition step may be greater than a maximum flow of the first reactant during the deposition step. In some embodiments of the invention, the flow rate of the first reactant may be increased during the at least one deposition step at a rate of about 2 sccm/sec to about 50 sccm/sec.

In some embodiments of the invention, the flow rate of the first reactant may be constant during a first deposition step, and the flow rate of the first reactant may be increased at a subsequent deposition step such that a total volume of the first reactant is increased in the subsequent deposition step. The flow rate of the second reactant may be constant in each of the first deposition step and the subsequent deposition step.

Methods according to some embodiments of the invention further include supplying a purge gas into the deposition chamber after a deposition step, and pumping the purge gas out of the deposition chamber. The purge gas may include an inert gas. In some embodiments of the invention, the purge gas may be provided for a time of about 12 to about 20 seconds.

In some embodiments of the invention, flowing the first reactant and the second reactant may be performed at a temperature of about 400° C. to about 550° C. and/or at a pressure of about 200 Torr to about 760 Torr.

The first reactant may include a silicon source material and/or the second reactant may include an oxidizing agent. The silicon source material may include $Si(OC_2H_5)_4$, $SiH_2Cl_2$, $SiCl_3SiCl_3$ and/or $SiR_4$ where R in includes one of —H, —$OCH_3$, —$OCH_2CH_2$ and —$O(CH_2)_nCH_3$ ($2 \leq n \leq 20$), and the oxidizing agent may include $O_3$, $O_2$, $H_2O$ and/or $H_2O_2$, In some embodiments of the invention, the recess may include a trench, an opening between gate patterns and/or an opening between sacrificial layer patterns for a node separation of a lower electrode of a cylindrical capacitor. A bottom layer of the multilayer structure may be conformally formed on a bottom surface and a side surface of the recess.

Methods of forming a trench isolation layer for a semiconductor device according to some embodiments of the invention include forming a trench on a semiconductor substrate, placing the semiconductor substrate in a deposition chamber, and providing a flow of first and second reactants onto the substrate for a predetermined deposition period, thereby conformally forming a first thin layer on a bottom surface and a side surface of the trench. The flow of the first and second reactants may be stopped from being provided onto the substrate for a predetermined pause period. Methods according to embodiments of the invention may further include repeating a sequence of providing a flow of the first and second reactants for a predetermined deposition period and stopping the flow of the first and second reactants for a predetermined pause period until the trench is filled up, thereby forming a multilayer structure in the trench.

In some embodiments of the invention, upper portions of the multilayer structure may be removed until a top portion of the trench is exposed. The multilayer structure may be at least partially removed by a chemical mechanical polishing (CMP) process.

Accordingly, some embodiments of the present invention may provide a semiconductor device including narrow recesses that are substantially completely filled up. Some embodiments of the present invention may also provide methods of filling up narrow recesses in semiconductor substrates. Some embodiments of the invention may also provide methods of forming a device isolation layer including a trench that is filled up with a dielectric material having reduced voids and/or seams therein.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
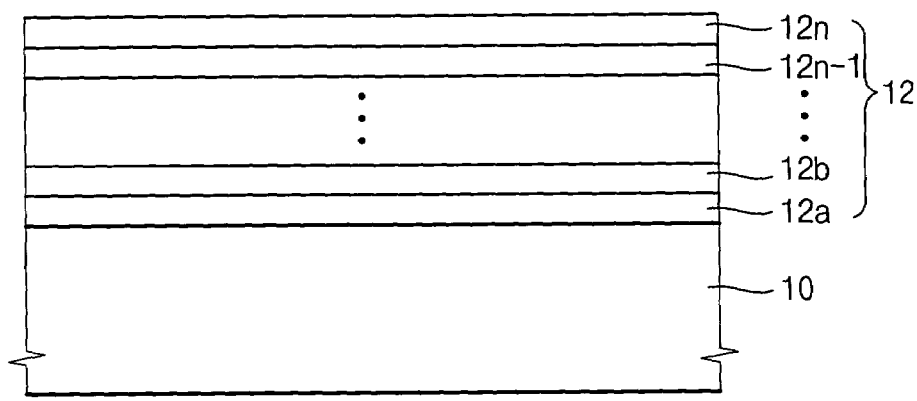
FIGS. 1 to 5B are cross sectional views illustrating semiconductor devices and associated methods according to some embodiments of the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

FIGS. 1 to 5B are cross sectional views illustrating semiconductor devices and associated methods according to exemplary embodiments of the present invention.

Figure 2:
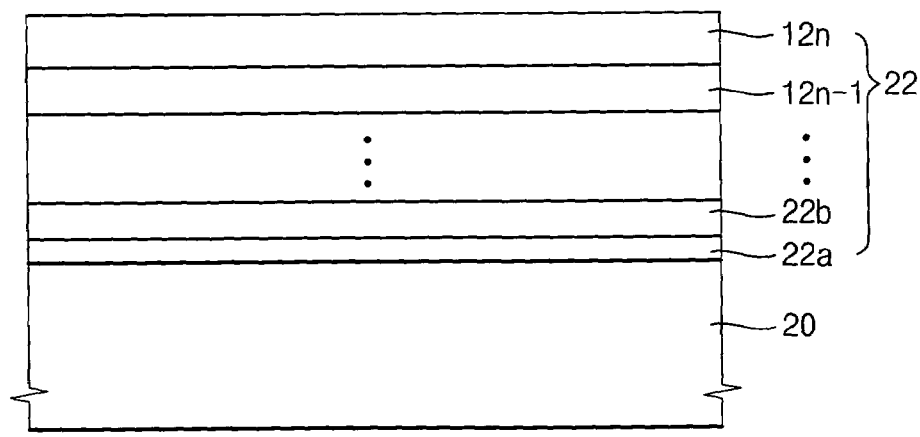

Referring to the embodiments of FIGS. 1 and 2, semiconductor device precursor structures including first structures 10 and 20 and second structures 12 and 22 on the first structures 10 and 20, respectively, are provided. The second structures 12 and 22 each include a multilayer arrangement having at least two thin layers. That is, the second structures 12 and 22 include first thin layers 12a and 22a, second thin layers 12b and 22b, . . . , an (n-1)th thin layer 12c and 22c and an nth thin layer 12d and 22d (wherein n is an integer) stacked in order on the first structure. The second structures 12, 22 may include a dielectric material such as, for example, silicon oxide. In some embodiments, the second structures 12 and 22 may include a multilayer arrangement having three, four, five or more thin layers.

The thickness of the thin layers may be uniform or varied in the multilayer arrangement. Each of the thin layers may have the same thickness in the multilayer arrangement as shown in FIG. 1, and/or the thickness of the thin layers may vary. For example, the thickness of the thin layers may be increased from a lower portion to an upper portion of the multilayer arrangement as shown in FIG. 2. As a result, the second thin layer 22b may have a thickness greater than that of the first thin layer 22a and the nth thin layer 22n may have a thickness greater than that of the (n-1)th thin layer 22n-1.

In some embodiments, structures 12, 22 may be formed by repeatedly flowing first and second reactants onto the first structures 10 and 20 together with each other in a deposition step of a chemical vapor deposition (CVD) process, followed by a predetermined pause period after each deposition step. That is, first and second reactants may be provided onto the first structures 10 and 20 to form a first thin layer on the first structures 10 and 20. The flow of reactants may be stopped during the pause period. Thereafter, the first and second reactants may again be provided onto the first thin layer, thereby forming a second thin layer on the first thin layer, followed by another pause period. Then, the first and second reactants may be provided after the pause period, thereby forming a third thin layer on the second thin layer.

In some embodiments, the first reactant may include a silicon source material, and the second reactant may include an oxidizing agent. Accordingly, the second structure 12, 22 may include silicon oxide. It will be understood that the flow of reactants may not be stopped completely during the pause period, but instead may be reduced sufficiently to substantially slow the formation of the silicon oxide on the first structure 10,20.

In some embodiments, a recessed portion (not shown) having an aspect ratio of about 3 or more may be formed in the first structures 10 and 20, and the second structures 12 and 22 may be filled into the recessed portion of the first structure 10, 20.

Figure 3A:
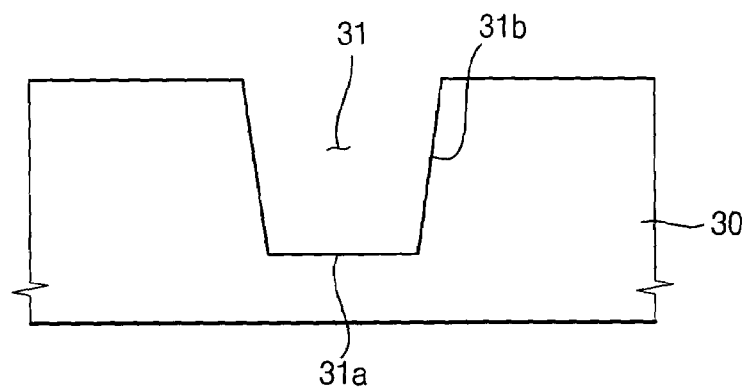
Figure 3B:
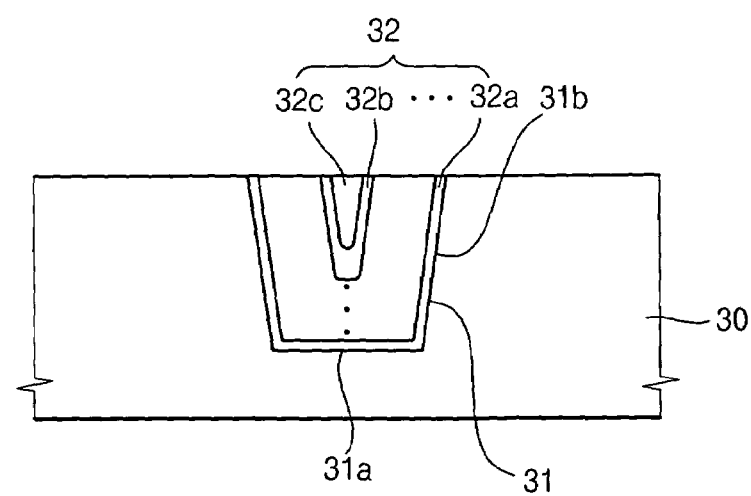

As shown in the embodiments of FIG. 3A, a first structure 30 includes a semiconductor substrate on which a trench 31 which may have an aspect ratio of about 3 or more is formed as a recess therein. A multilayer structure 32 including at least two thin layers 32a, 32b, etc., is filled into the trench as shown in FIG. 3B. In some embodiments, the trench 31 in the first structure 30 may be substantially completely filled with the second structure 32 in spite of the large aspect ratio of the trench 31 because the thin layers are formed consecutively in the recessed portion, thereby forming a multilayer structure 32 including at least two thin layers. In particular, thin layers 32a, 32b, etc., may be coated repeatedly on a bottom surface 31a and a side surface 31b of the recessed portion 31, so that a multilayer structure 32 may be formed in the trench 31 with reduced layer defects such as voids and/or seams.

Figure 4A:
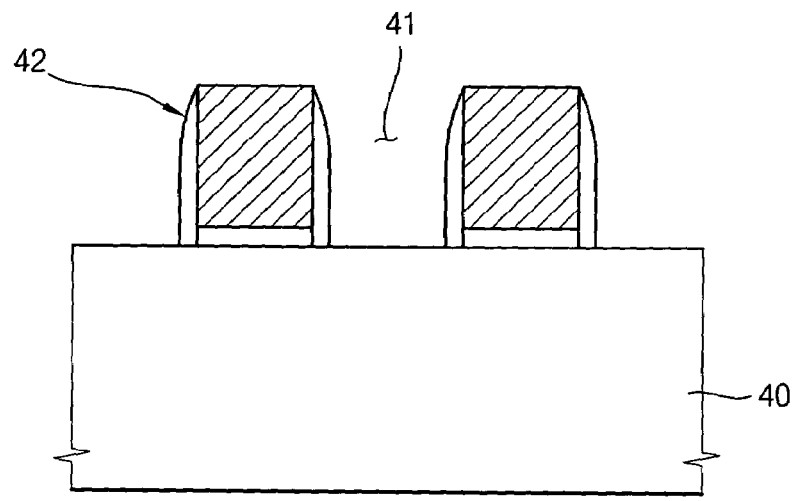
Figure 4B:
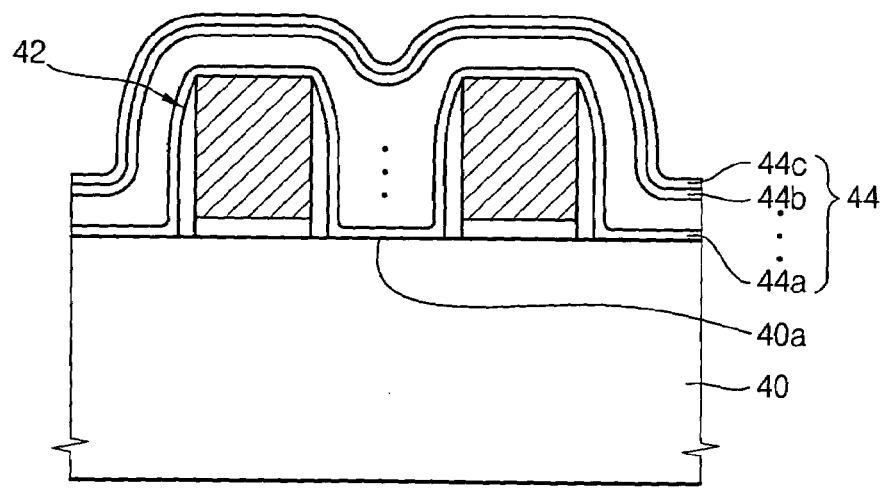

Referring to the embodiments of FIG. 4A, a gate pattern 42 is provided on a semiconductor substrate 40 as a first structure, and a space between the gate patterns 42 is provided as a recessed portion 41. A multilayer structure 44 having at least two thin layers 44a, 44b, etc., may be formed on the substrate 40 including the gate pattern 42 as the second structure until the recessed portion 41 is filled with the multilayer structure as shown in FIG. 4B. In particular, the recessed portion 41 may be filled with a multilayer structure 44 by periodically repeatedly forming layers having thicknesses substantially smaller than the width of the recessed portion 41. In addition, thin layers 44a, 44b, etc., of the multilayer structure 44 may be consecutively formed on a top surface 40a of the substrate 40 exposed through the recessed portion 41 and sidewalls of the gate pattern 42 in the recessed portion 41, so that the recessed portion 41 is filled with a multilayer structure 44 having reduced defects such as voids and/or seams. As a result, an insulation layer for isolating conductive structures (generally referred to as a device isolation layer) may be formed as a plug in the recessed portion 41 on the substrate 40.

Figure 5A:
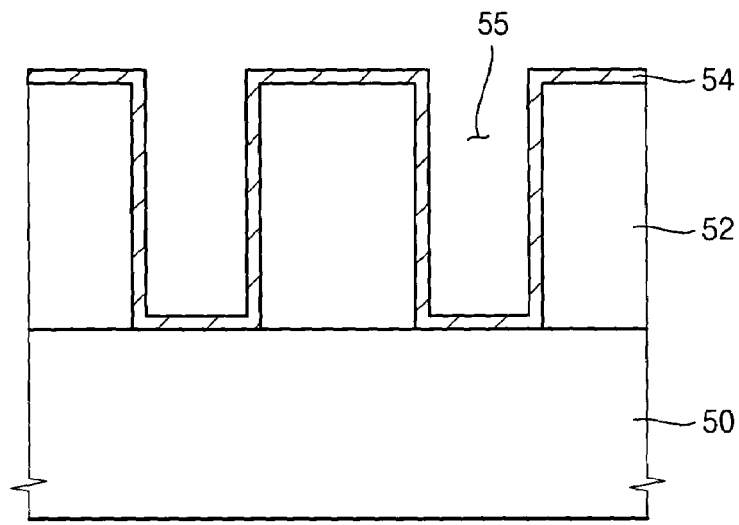
Figure 5B:
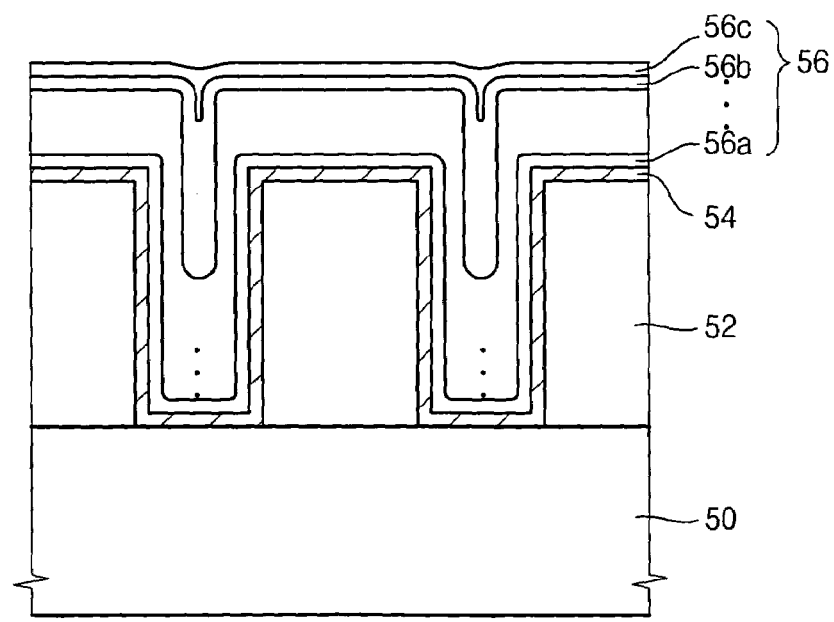

Referring to the embodiments of FIG. 5A, an insulation interlayer pattern 52 is formed on a semiconductor substrate 50 as the first structure of an exemplary semiconductor device, and an opening 55 formed in the insulation interlayer pattern 52 is provided as the recessed portion of the first structure. A lower electrode 54 of a cylindrical capacitor may be formed on the insulation interlayer 52. As shown in FIG. 5B, a multilayer structure 56 having at least two thin layers 56a, 56b, etc., may be formed on the lower electrode 54 as the second structure of a semiconductor device. As described above, the opening 55 may be filled with a multilayer structure 56, which is formed by repeatedly forming a layer having a thickness much smaller than the width of the opening 55. In addition, a bottom thin layer 56a of the multilayer structure 56 may be consecutively coated on a top surface of the electrode 54 on the portion of the substrate 50 beneath the opening 55, and sidewalls of the insulation interlayer pattern 52 and the electrode 54 in the opening 55, so that the opening 55 may be filled with a multilayer structure 56 having reduced defects such as voids and/or seams. As a result, a sacrificial layer for node separation for a cylindrical capacitor may be formed in the opening 55 with reduced defects such as voids and/or seams.

Embodiment 1

Figure 6A:
FIGS. 6A and 6B are cross sectional views illustrating processing steps of methods of forming a semiconductor device according to some embodiments of the invention.
Figure 6B:
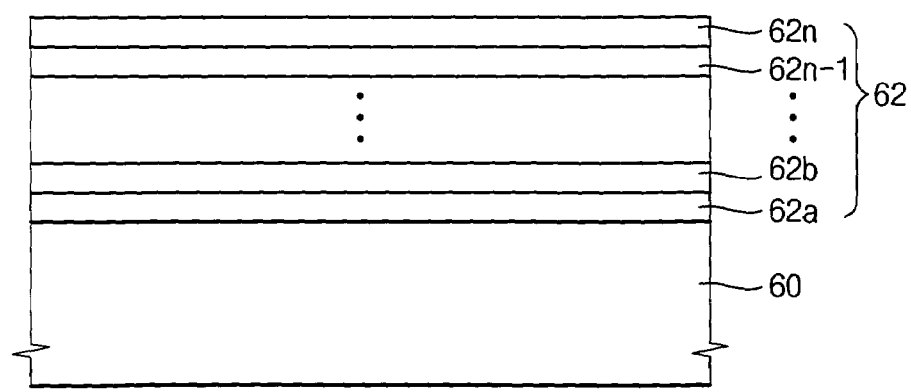
Figure 7:
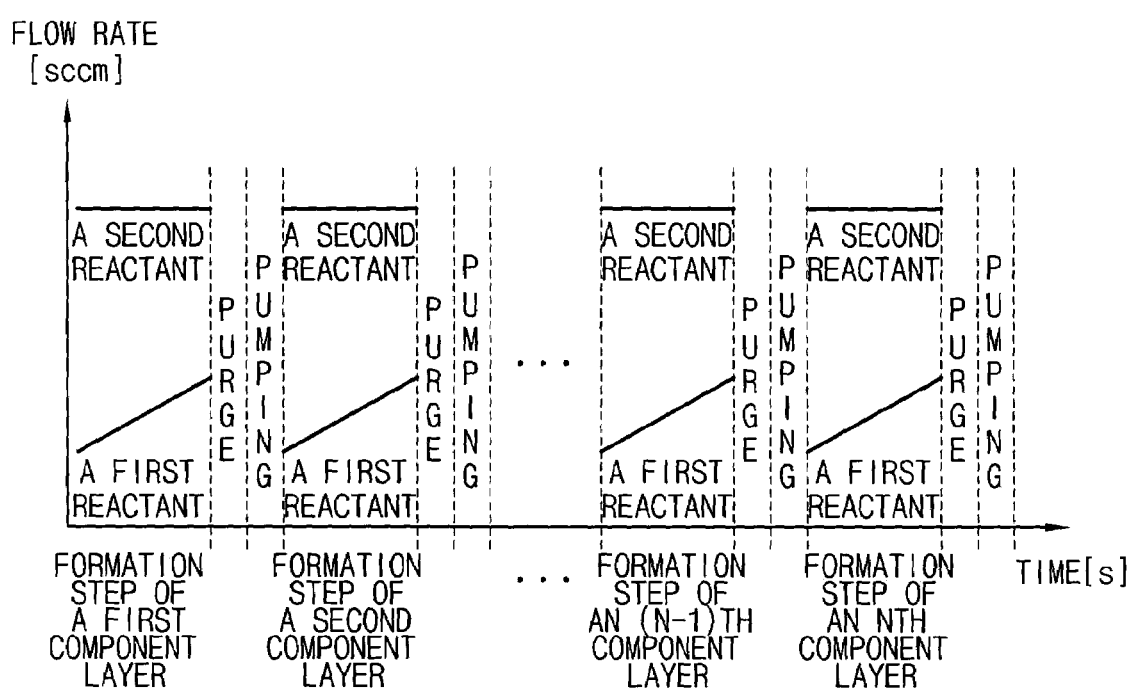
FIG. 7 is a timing diagram illustrating a flow rate of first and second reactants as a function of a time when a multilayer structure is formed according to some embodiments of the invention.

FIGS. 6A and 6B are cross sectional views illustrating processing steps of methods of forming semiconductor devices according to some embodiments of the invention. FIG. 7 is a timing diagram illustrating flow rates of first and second reactants as a function of a time when a multilayer structure is formed in accordance with some embodiments of the invention. In FIG. 7, the flow rate is expressed in units of standard cubic centimeters per minute (sccm), and time is expressed in units of seconds.

Referring to the embodiments of FIG. 6A, a first structure 60 is provided. The first structure 60 may include a silicon substrate, a silicon-on-insulator (SOI) substrate, a silicon substrate on which a trench is formed, an SOI substrate on which a trench is formed, a gate pattern formed on a base and/or an insulation interlayer pattern on which a lower electrode of a cylindrical capacitor is formed.

Referring to the embodiments of FIGS. 6B and 7, first and second reactants may be repeatedly provided together onto the first structure 60 in a CVD deposition step, from several times up to several tens of times, or more. Each deposition step may be followed by a predetermined pause period during which residual gases may be removed. By repeatedly performing a deposition step followed by a pause, a second structure 62 including a first thin layer 62a a second thin layer 62b. . . , an (n-1)th thin layer 62n-1 and an nth thin layer 62n may be formed on the first structure 60. That is, the first and second reactants may be provided onto the first structure 60, thereby forming a first thin layer 62a on the first structure 60, and then may be stopped from being provided during the pause period. As noted above, the flow of the first and second reactant gases may not be stopped entirely during the pause period, but the flow of such reactants may be reduced.

In the pause period, a purge gas may be supplied to the deposition chamber and pumped out to remove residual gases that have not chemically reacted to form the second structure 62. Thereafter, the first and second reactants may again be provided onto the first thin layer 62a to thereby form a second thin layer 62b on the first thin layer 62a. Then, the first and second reactants may be provided after the end of the pause period, thereby forming a third thin layer (not shown) on the second thin layer 62b. The process described above may be repeated until the nth thin layer 62n is formed on the (n-1)th thin layer 62n-1. Accordingly, three repetitions of the same process on the first structure 60 may form the second structure 62 into a multilayer structure having three thin layers, and five repetitions of the same process on the first structure 60 may form the second structure 60 into a multilayer structure having five thin layers.

In certain embodiments, each of the thin layers 62a, 62b, etc., may have the same thickness. The total volume of the first reactant may be similar during each deposition step. The flow rate of the first reactant may be represented as a linear function of time, as shown in FIG. 7. Accordingly, while the volume of the first reactant may increase with time during each deposition step, the total volume of the first reactant provided during each deposition step may be similar to that supplied in other deposition steps.

The total volume of the second reactant may also be similar at each deposition step. For example, the flow rate of the second reactant may be represented as a constant function of time, as shown in FIG. 7. That is, the second reactant may be constantly provided to a predetermined volume during each deposition step. In some embodiments, the total volume of the second reactant is substantially greater than the maximum flow rate of the first reactant. As a result, the sum of the volume of the first and second reactants may be similar at each deposition step, so that each of the thin layers may be formed to have a thickness similar to the other layers.

As an example, a silicon source material may be utilized as the first reactant, and an oxidizing agent may be utilized as the second reactant. Examples of silicon source material include $Si(OC_2H_5)_4$, $SiH_2Cl_2$, $SiCl_3SiCl_3$ and $SiR_4$ (wherein, R in $SiR_4$ includes one of —H, —$OCH_3$, —$OCH_2CH_2$ and —$O(CH_2)_nCH_3$, where n is a positive number ranging from 2 to 20), etc. These silicon source materials may be used alone or in combinations thereof. In accordance with some embodiments, an $Si(OC_2H_5)_4$ gas may be used as the first reactant. The $Si(OC_2H_5)_4$ gas may be changed into a gaseous state by means of a phase changer such as a bubbler since the $Si(OC_2H_5)_4$ gas is in a liquid state at room temperature and atmospheric pressure. Examples of the oxidizing agent include $O_3$, $O_2$, $H_2O$ and $H_2O_2$, etc., either alone or in combinations thereof. In some embodiments, ozone ($O_3$), having a superior reactivity, may be used as the second reactant.

The first and second reactants may be provided into a deposition chamber at a temperature in a range from about 400° C. to about 550° C. When the first and second reactants are provided into a deposition chamber at a temperature below about 400° C., the reaction velocity between the first and second reactants and the first structure 60 may be very low. When the first and second reactants are provided into a chamber at a temperature above about 550° C., the reaction velocity between the first and second reactants and the first structure 60 may be too high to control the chemical reaction of the reactants with the first structure 60.

The first and second reactants are preferably provided into the chamber at a temperature in a range from about 430° C. to about 540° C., and more preferably at a temperature in a range from about 480° C. to about 520° C. In some embodiments, the first and second reactants may be provided into the chamber at a temperature of about 500° C. In addition, the first and second reactants may be provided into the chamber at a pressure in a range from about 200 Torr to about 760 Torr, and preferably at a pressure in a range from about 400 Torr to about 760 Torr and more preferably 600 Torr to about 760 Torr. In some embodiments, the first and second reactants may be provided into the chamber at a pressure of about 760 Torr.

During the pause period, the flow of the first and second reactants into the chamber may be stopped or substantially reduced. During the pause period, a purge gas may be provided into the deposition chamber. The purge gas may then be pumped out from the deposition chamber so as to remove residual (i.e. unreacted) gases from the chamber. The purge gas may include an inactive gas such as, for example a nitrogen ($N_2$) gas and/or an inert gas such as argon (Ar), helium (He), etc. These inactive gases may be used alone or in combinations thereof.

Accordingly, the first and second reactants may be repeatedly provided together an arbitrary number of times onto the first structure 60 with each deposition step followed by a predetermined pause period, thereby forming the second structure 62 including the first thin layer 62a the second thin layer 62b. . . , the (n-1)th thin layer 62n-1 and the nth thin layer 62n on the first structure 60.

In particular, the first structure 60 may be loaded into a deposition chamber, and the deposition chamber may be controlled to have a predetermined interior pressure and temperature. Then, the first and second reactants may be provided onto the first structure 60, for example, by flowing the source gases through the deposition chamber. The volume of the first reactant may be increased with time, and the second reactant may be provided at a flow rate substantially greater than the maximum flow rate of the first reactant. Then, the flow of the first and second reactants may be stopped, and a purge gas may be provided into the chamber. When the purge gas is pumped out from the chamber, residual gases, for example, gases that are not chemically reacted to the first structure 60, may be removed from the chamber. As a result, the first thin layer 62a may be formed on the first structure 60, thereby completing a first formation step.

Then, the same process as in the first formation step may be performed repeatedly in the chamber, so that a second thin layer 62b is formed on the first thin layer 62a, thereby completing a second formation step.

The same process as in the first or the second formation step is repeatedly performed a number of times, so that the first, second, . . . , the (n-1)th and the nth thin layers 62a, 62b, . . . , 62n-1 and 62n are stacked on the first structure 60, thereby forming the second structure 62 on the first structure 60.

A method of forming a multilayer structure by repeated deposition is disclosed in U.S. Patent Application Publication Nos. 2003/104126 and 2003/235961. However, in the methods disclosed in the above U.S. patent publications, the reactants are provided repeatedly without a pause period for purging a residual gas from the chamber. In addition, according to embodiments of the present invention, thin layers of the multilayer may be formed through a chemical vapor deposition (CVD) process, which may be clearly distinguished from an atomic layer deposition (ALD) process.

According to the some embodiments of the invention, the first and second reactants may be repeatedly provided into the deposition chamber through a CVD process, followed by a predetermined pause period, thereby forming a second structure 62 on the first structure 60 as a multilayer structure in which the thin layers have substantially similar thicknesses.

Embodiment 2

Figure 8A:
FIGS. 8A and 8B are cross sectional views illustrating processing steps of methods of forming a semiconductor device according to further embodiments of the invention.
Figure 8B:
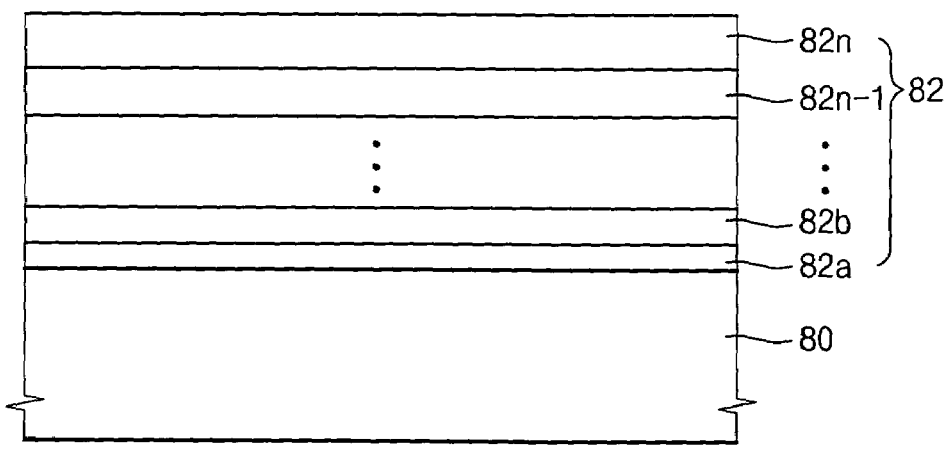
Figure 9:
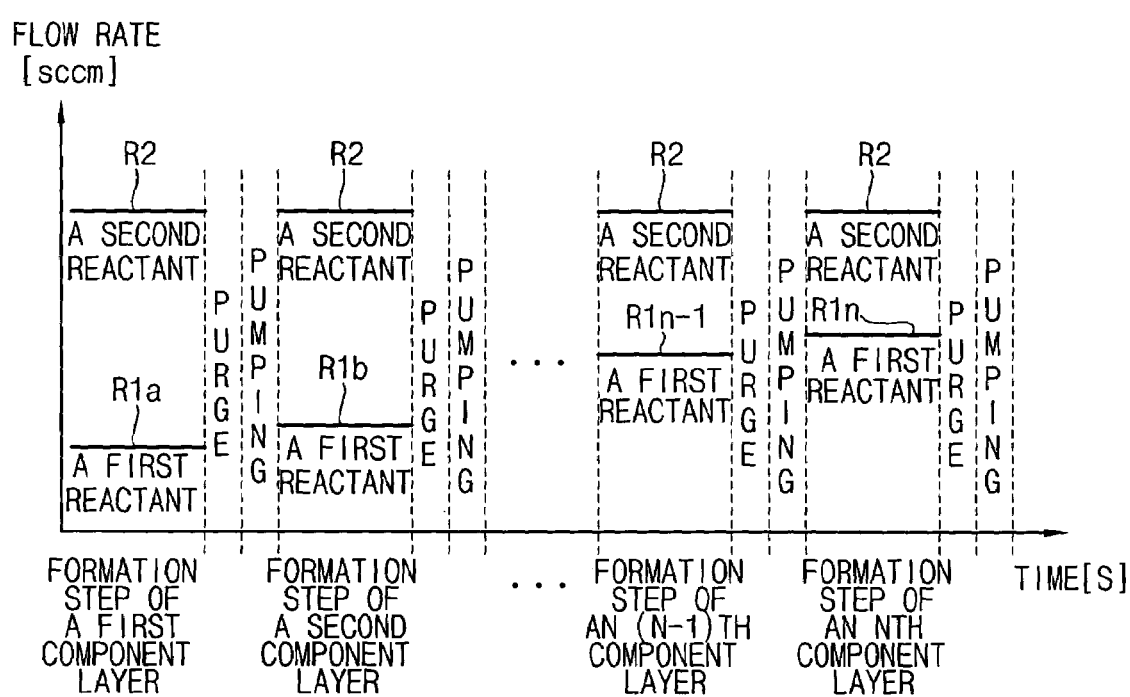
FIG. 9 is a timing diagram illustrating a flow rate of first and second reactants as a function of a time when a multilayer structure is formed according to further embodiments of the invention.

FIGS. 8A and 8B are cross sectional views illustrating methods of forming semiconductor devices according to further embodiments of the invention. FIG. 9 is a timing diagram illustrating flow rates of first and second reactants as a function of a time during formation of a multilayer structure 82. In FIG. 9, the flow rate is expressed in units of standard cubic centimeters per minute (sccm), and time is expressed in seconds. The embodiments illustrated in FIGS. 8A-9 are similar to those described in connection with FIGS. 6A-7, except that each of the thin layers in the multilayer structure 82 may have a thickness different from the others.

Referring to FIGS. 8A, 8B and 9, a first structure 80 is provided. The first structure 80 may include a silicon substrate, a silicon-on-insulator (SOI) substrate, a silicon substrate on which a trench is formed, a SOI substrate on which a trench is formed, a gate pattern formed on a base and an insulation interlayer pattern on which a lower electrode of a cylindrical capacitor is formed.

First and second reactants may be provided repeatedly from several times to several tens of times or more onto the first structure 80 together with each other. Each deposition step may be followed by a predetermined pause period. By repeatedly performing a deposition followed by a pause period, the second structure 82 including a first thin layer 82a a second thin layer 82b , . . . , an (n-1)th thin layer 82n-1 and an nth thin layer 82n may be formed on the first structure 80.

In these embodiments, the second thin layer 82b may have a thickness greater than that of the first thin layer 82a underlying the second thin layer 82a and the nth thin layer 82n may have a thickness greater than that of the (n-1)th thin layer 82n-1 underlying the nth thin layer 82n. That is, the thickness of each thin layer of the multilayer may increase from the first thin layer 82a to the nth thin layer 82n.

The total volume of the first reactant supplied to the deposition chamber may increase with each deposition step. The flow rate R1 of the first reactant may be illustrated as a function of time, as shown in FIG. 9. Accordingly, the first reactant may be provided at a first predetermined flow rate R1a which is increased with every deposition step. For example, the first flow rate R1a may be lower than the second flow rate R1b. Thus, the total volume of the first reactant may increase as the deposition step is repeated.

The total volume of the second reactant may be substantially the same at each deposition step. The flow rate R2 of the second reactant may be a constant function of the time, as shown in FIG. 9. That is, the second reactant may be constantly provided at a predetermined volume at each deposition step. The total volume of the second reactant may be greater than that of the first reactant, as shown in FIG. 9. As a result, the combined volume of the first and second reactants may also increases as the deposition step is repeated, so that the thickness of the thin layer may increase from the first thin layer 82a to the nth thin layer 82n.

In particular, the first structure 80 may be loaded into a deposition chamber that is controlled to have a predetermined interior pressure and temperature. Then, the first and second reactants may be provided together onto the first structure 80. In such a case, the first reactant may be provided at a first flow rate R1a and the second reactant may be provided at a flow rate R2 greater the first flow rate R1a. Then, the flow of the first and second reactants into the chamber may be stopped, and a purge gas may be provided into the chamber. When the purge gas is pumped out of the chamber, residual gases may be removed from the chamber. As a result, the first thin layer 82a may be formed on the first structure 80 to a first thickness, thereby completing a first formation step.

Then, the same process as in the first formation step may be performed again, except that the first reactant may be provided at a second flow rate R1b higher than the first flow rate R1a in the first formation step. Accordingly, the second thin layer 82b may be formed on the first thin layer 82a to have a second thickness greater than the first thickness of the first thin layer 82a thereby completing a second formation step.

The same process as in the first or the second formation step is repeatedly performed several times. In each deposition step, the flow rate of the first reactant may increase so that the first, second, ..., the (n-1)th and the nth thin layer 82a, 82b, ..., 82n-1 and 82n are formed on the first structure 80 with sequentially increasing thicknesses. In some embodiments of the invention, each of the flow rates R1a, R1b, etc., of the first reactant may be lower than the flow rate R2 of the second reactant, so that the total volume of the first reactant may be lower than that of the second reactant when provided into the chamber.

According to some embodiments of the invention, the first and second reactants may be repeatedly provided into the chamber through a CVD process, followed by a predetermined pause period after each deposition for removing residual gas, thereby forming a second multilayer structure 82 on the first structure 80. The thickness of each thin layer in the multilayer structure 82 may increase from a bottom portion to a top portion of the multilayer structure 82.

Embodiment 3

FIGS. 10A to 10D are cross sectional views illustrating methods of forming device isolation layers according to further embodiments of the invention.

Figure 10A:
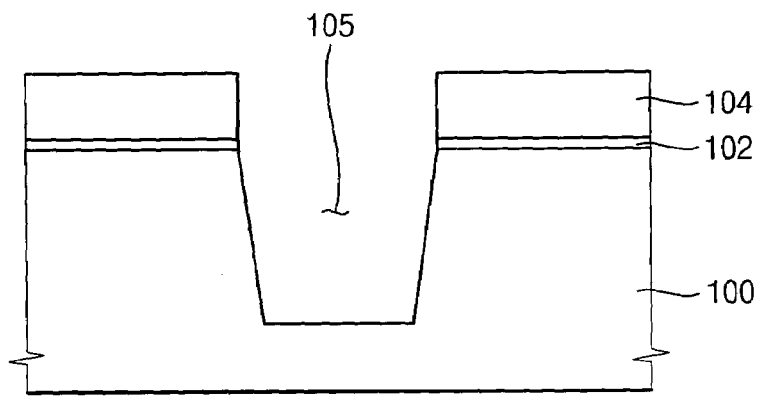
FIGS. 10A to 10D are cross sectional views illustrating processing steps for methods of forming device isolation layers according to further embodiments of the invention.

Referring to the embodiments of FIG. 10A, a pad oxide layer (not shown) and a pad nitride layer (not shown) may be sequentially formed on a semiconductor substrate 100. A photolithography process may be performed on the pad oxide layer and the pad nitride layer to form a pad oxide pattern 102 and a pad nitride pattern 104 on the substrate 100. Then, the substrate 100 may be selectively etched away using the pad oxide pattern 102 and a pad nitride pattern 104 as an etching mask, thereby forming a trench 105 in the substrate 100. Additional processes may be performed on the substrate 100 for repairing damage to the substrate 100 that may occur during the above etching process.

Figure 10B:
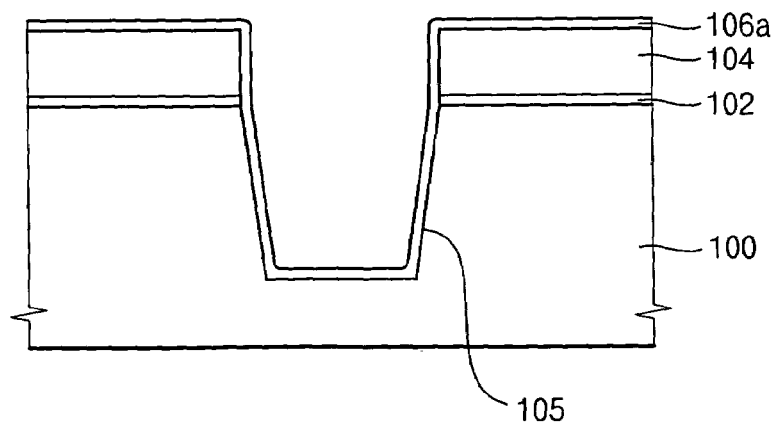
Figure 10C:
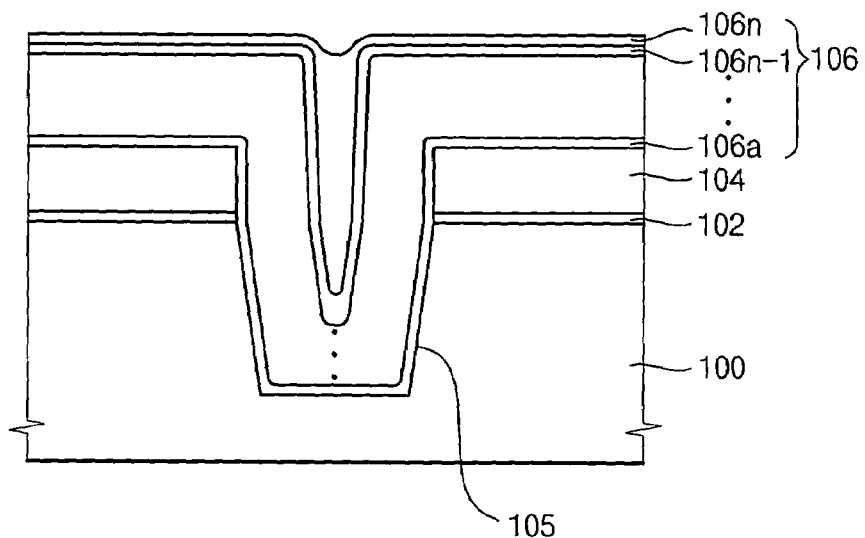

Referring to the embodiments of FIGS. 10B and 10C, the same or similar process as described in connection with embodiments of FIGS. 6A and 6B may be performed on the substrate 100, so that a multilayer structure 106 is coated on the substrate 100 including the trench 105. The multilayer structure 106 may include a first thin layer 106a, ..., an (n-1)th thin layer 106n-1 and an nth thin layer 106n formed in order on the substrate 100. In some embodiments, each thin layer of the multilayer structure 106 may have the same thickness. As described in connection with the embodiments of FIGS. 6A and 6B, the multilayer structure 106 may be formed through a CVD process, so that the first thin layer 106a may be conformally coated on bottom and side surfaces of the trench 105. The second thin layer 106b may also be conformally coated on the first thin layer 106a. In the above process, which is repeated several times, the nth thin layer 106n may be conformally coated on the (n-1)th thin layer 106n-.

When a single layer is formed on the substrate 100 with a thickness sufficient to fill the trench 105 by a single process, an overhang may be generated at an upper portion of the trench 105, so that deposition defects such as voids and/or seams may be created in the single layer in the trench 105. However, a multilayer structure 106 according to some embodiments of the present invention may be formed by periodically repeating a deposition process for a thin layer having a thickness much smaller than the width of the trench 105, so that the multilayer structure 106 may have reduced defects such as voids and/or seams therein due to the narrow width of the trench 105.

Figure 10D:
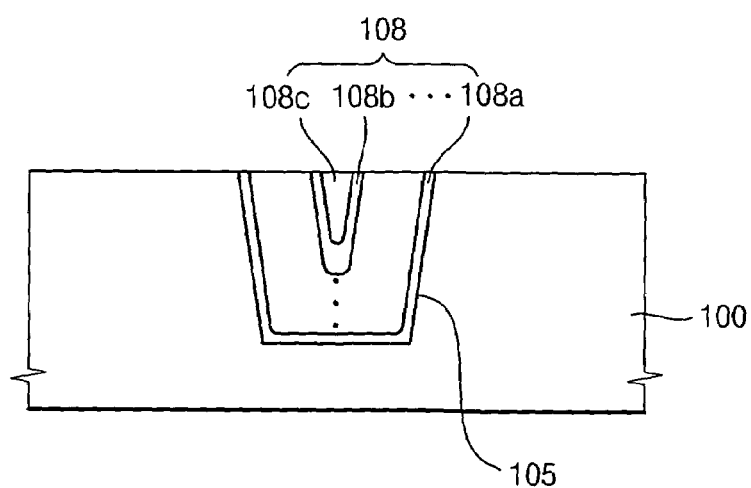

Referring to FIG. 10D, the multilayer structure 106 may be removed and planarized until a top surface of the pad nitride pattern 104 is exposed by, for example, a chemical mechanical polishing (CMP) process. The pad nitride pattern 104 and the pad oxide pattern 102 may be sequentially removed from the substrate 100. As a result, the multilayer structure 106 including the thin layers 106a, 106b, etc. may remain only in the trench 105, thereby forming a device isolation layer 108 with reduced defects such as voids and/or seams in the trench 105. That is, the device isolation layer 108 may be a multilayer structure including a plurality of thin layers 108a, 108b, etc., with reduced voids and/or seams.

Embodiment 4

Figure 11:
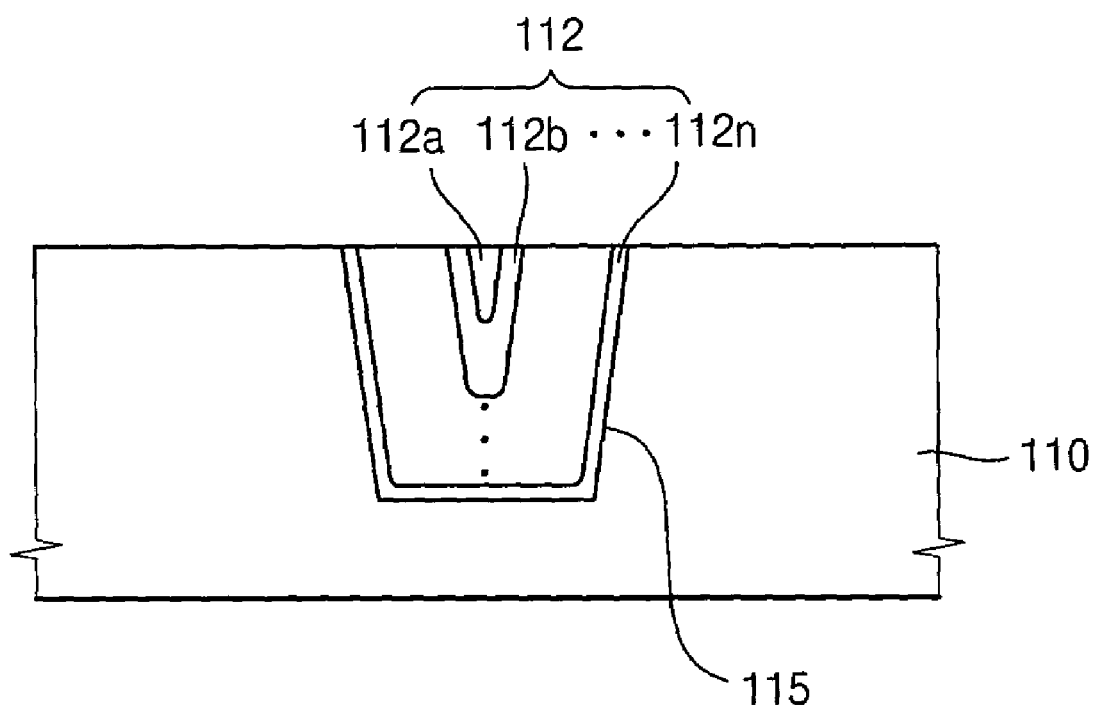
FIG. 11 is a cross sectional view illustrating device isolation layers and associated methods according to some embodiments of the invention.

FIG. 11 is a cross sectional view illustrating a device isolation layer and associated methods according to further embodiments of the invention.

Referring to the embodiments of FIG. 11, a trench 115 may be formed on the substrate 110 in the same process as described in connection with the embodiments of FIGS. 10A-10D. The second structure in the embodiments of FIGS. 8A, 8B may be formed on the substrate 110 including the trench 115. As a result, a multilayer structure 112 including at least two thin layers of which thicknesses increase from the substrate 110 may be formed to fill the trench 115 on the substrate 110. Then, the multilayer structure may be removed and planarized until a top surface of the pad nitride pattern is exposed by, for example, a chemical mechanical polishing (CMP) process. The pad nitride pattern and the pad oxide pattern may be sequentially removed from the substrate 110.

As a result, the multilayer structure 112 including the thin layers of which thicknesses upwardly increase from the substrate 110 only remains in the trench 115, thereby forming a device isolation layer with reduced defects such as voids and/or seams in the trench 115. That is, the device isolation layer 112 may be formed into a multilayer structure including a plurality of thin layers 108a, 108b, etc., with reduced voids and/or seams, and the thicknesses of the thin layers may increase from a bottom portion to a top portion of the device isolation layer 112.

In some embodiments of the invention, a trench may be formed on a substrate to have a depth of about 3,000 Å to about 4,000 Å and a width of about 500 Å to about 1,000 Å. First and second reactants may be provided with each other onto the substrate including the trench together. The first reactant may be provided at a constant or increasing flow rate of about 100 sccm to about 3,000 sccm for the formation step of each thin layer, and the second reactant may be provided at a constant flow rate of about 6,000 sccm to about 20,000 sccm. When the first reactant is provided into the deposition chamber at an increasing flow rate, the rate of change of the flow rate with respect to time may be in a range of about 2 sccm/sec to about 50 sccm/sec. Then, the flow of the first and second reactants into the deposition chamber may be stopped or reduced, and a purge gas may be provided into the chamber. When the purge gas is pumped out from the chamber, residual gases that are not chemically reacted to the substrate may be removed from the chamber. In such case, the first and second reactants may be provided for a time of about 200 seconds to about 250 seconds, and the purge gas may be provided for a time of about 12 seconds to about 20 seconds. The purge gas may also be pumped out for a time of about 12 seconds to about 20 seconds. In the above process, the chamber may have a temperature of about 400° C. to about 550° C. and a pressure of about 200 Torr to about 760 Torr.

Although the processes disclosed in the third and fourth embodiments are disclosed as examples of forming a device isolation layer, a plug-type insulation interlayer and/or a sacrificial layer for a node separation of a lower electrode of a cylindrical capacitor and/or any other structure (channel) to be filled with an insulating material known to one of the ordinary skill in the art could also be created by similar processes. As a result, a plug-type insulation interlayer may be formed in an opening with reduced voids and/or seams despite the opening having a narrow width. The sacrificial layer may also be formed in an opening defined by an insulation interlayer pattern with reduced voids and/or seams.

Experiment 1

Figure 12:
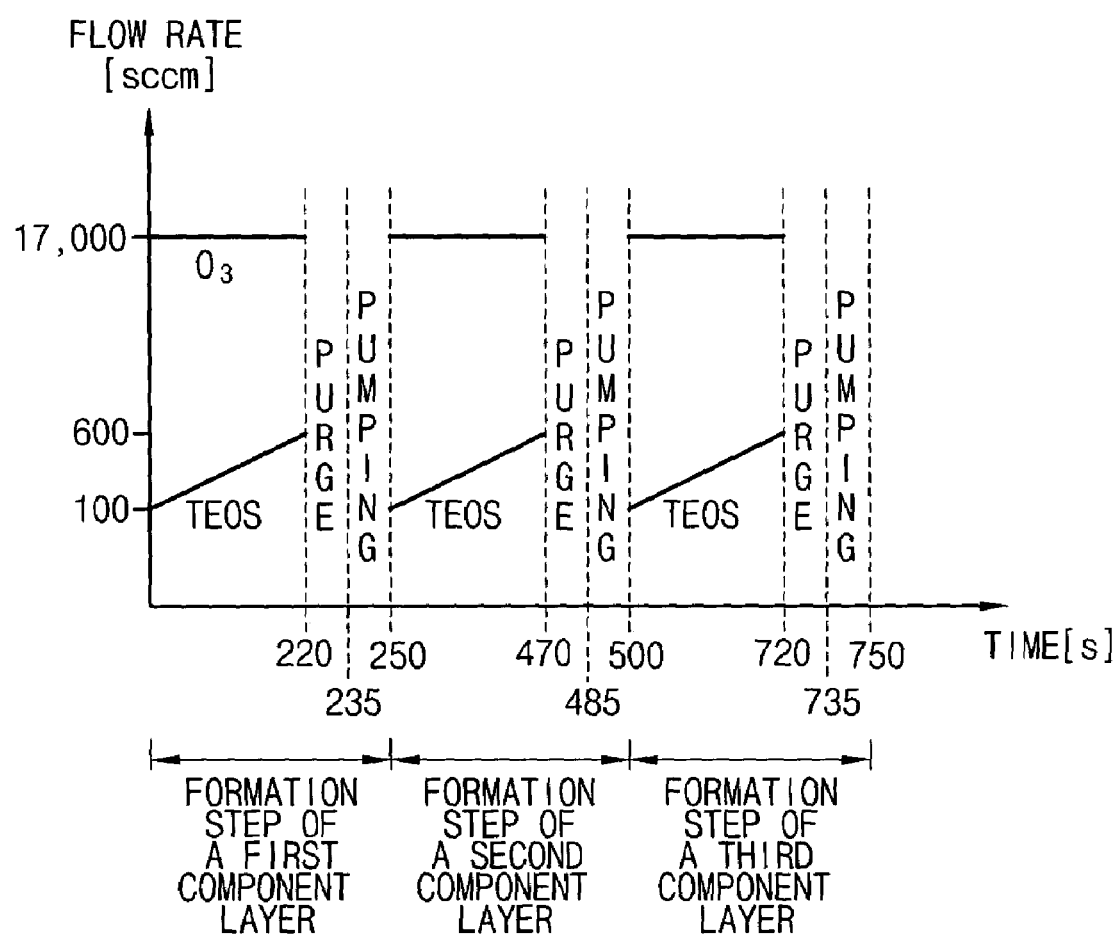
FIG. 12 is a timing diagram illustrating a flow rate of first and second reactants as a function of a time when a device isolation layer is formed according to some embodiments of the invention.

FIG. 12 is a timing diagram illustrating flow rates of first and second reactants as a function of a time when a device isolation layer is formed in accordance with the process as described in connection with FIGS. 10A-10D.

A trench was formed to have a depth of about 3,500 Å and a width of about 600 Å on a semiconductor substrate. Tetraethyl orthosilicate (TEOS, $Si(OC_2H_5)_4$) gas, which was changed from a liquid state through a bubbler, was utilized as the first reactant. The TEOS gas was provided for about 220 seconds, and a flow rate of the TEOS gas was linearly increased from about 100 sccm to about 600 sccm. Ozone ($O_3$) gas was utilized as the second reactant, and was constantly provided at a flow rate of about 17,000 sccm. Nitrogen ($N_2$) gas was provided for about 15 seconds as the purge gas, and was pumped out from the chamber for about 15 seconds. An inner temperature of the chamber was about 500° C., and an inner pressure of the chamber was about 760 Torr.

Under the above conditions, a first thin layer of the device isolation layer was conformally coated on bottom and side surfaces of the trench to a thickness of about 200 Å.

The same process as for the first thin layer was repeated twice more, thereby forming second and third thin layers, each of which had a thickness similar to that of the first thin layer. As a result, a device isolation layer was formed as a multilayer structure having first, second and third thin layers having similar thickness without apparent defects such as voids and/or seams.

Experiment 2

Figure 13:
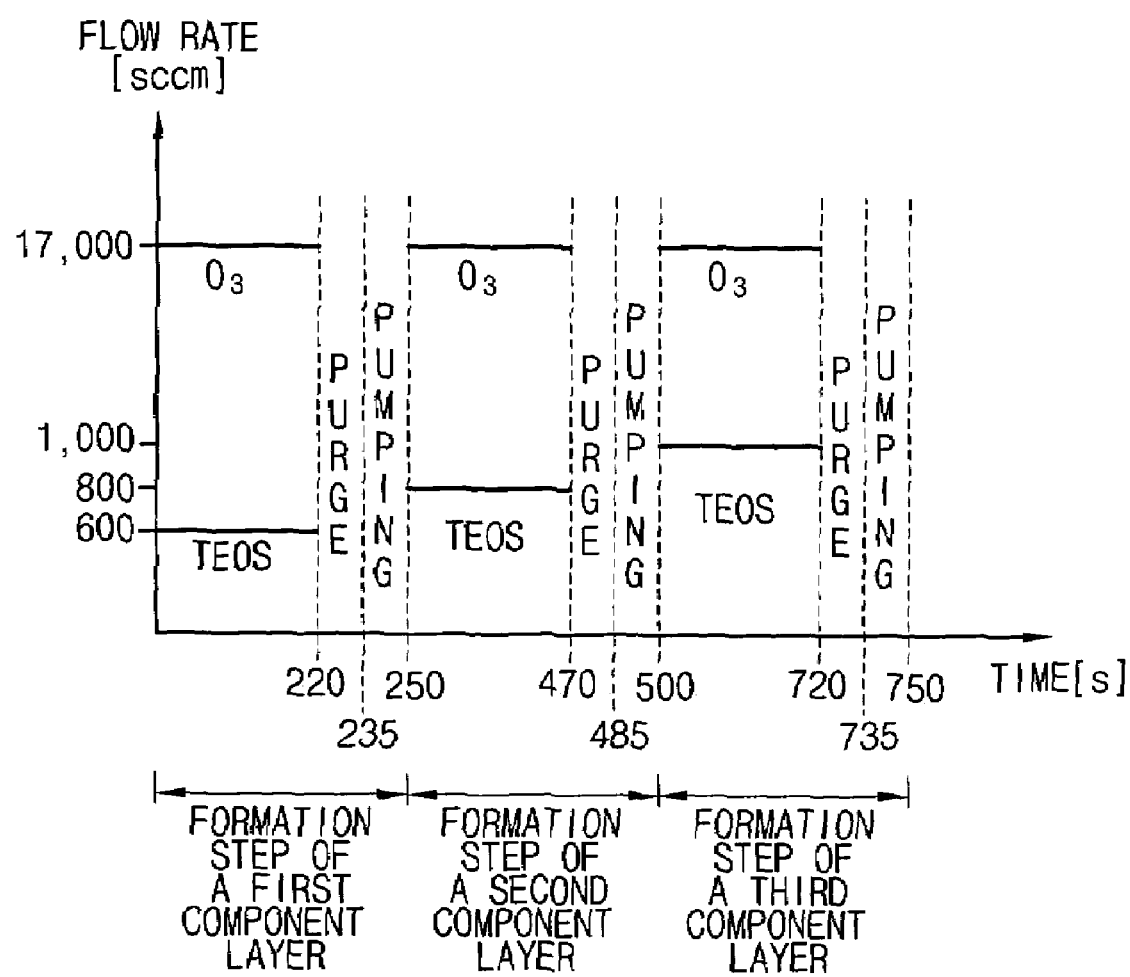
FIG. 13 is a timing diagram illustrating a flow rate of first and second reactants as a function of a time when a device isolation layer is formed according to further embodiments of the invention.

FIG. 13 is a timing diagram illustrating a flow rate of first and second reactants as a function of time when a device isolation layer is formed in the same process as described in connection with the embodiments of FIG. 11.

A trench was formed to have a depth of about 3,500 Å and a width of about 600 Å on a semiconductor substrate. Tetraethyl orthosilicate (TEOS, $Si(OC_2H_5)_4$) gas, which was changed from a liquid state through a bubbler, was utilized as the first reactant, and ozone ($O_3$) gas was utilized as the second reactant. The TEOS gas was provided for about 220 seconds at a flow rate of about 600 sccm, and the ozone ($O_3$) gas was also provided for about 220 seconds at a flow rate of about 17,000 sccm under conditions that the inner temperature of the chamber was about 500° C. and the inner pressure of the chamber was about 760 Torr. A purge gas was provided into the chamber and pumped out from the chamber for about 15 seconds. Under the above conditions, a first thin layer of the device isolation layer was conformally coated on bottom and side surfaces of the trench to a thickness of about 160 Å.

In the same process as for the first thin layer, except that the TEOS gas was provided at a flow rate of about 800 sccm, a second thin layer of the device isolation layer was conformally formed on the first thin layer to a thickness of about 190 Å.

In the same process as for the first thin layer, except that the TEOS gas was provided at a flow rate of about 1,000 sccm, a third thin layer of the device isolation layer was also conformally formed on the second thin layer to a thickness of about 250 Å.

As a result, a device isolation layer was formed into a multilayer structure having first, second and third thin layers with increasing thicknesses without apparent defects such as voids and/or seams.

Filling-Up Property of a Device Isolation Layer

Figure 14:
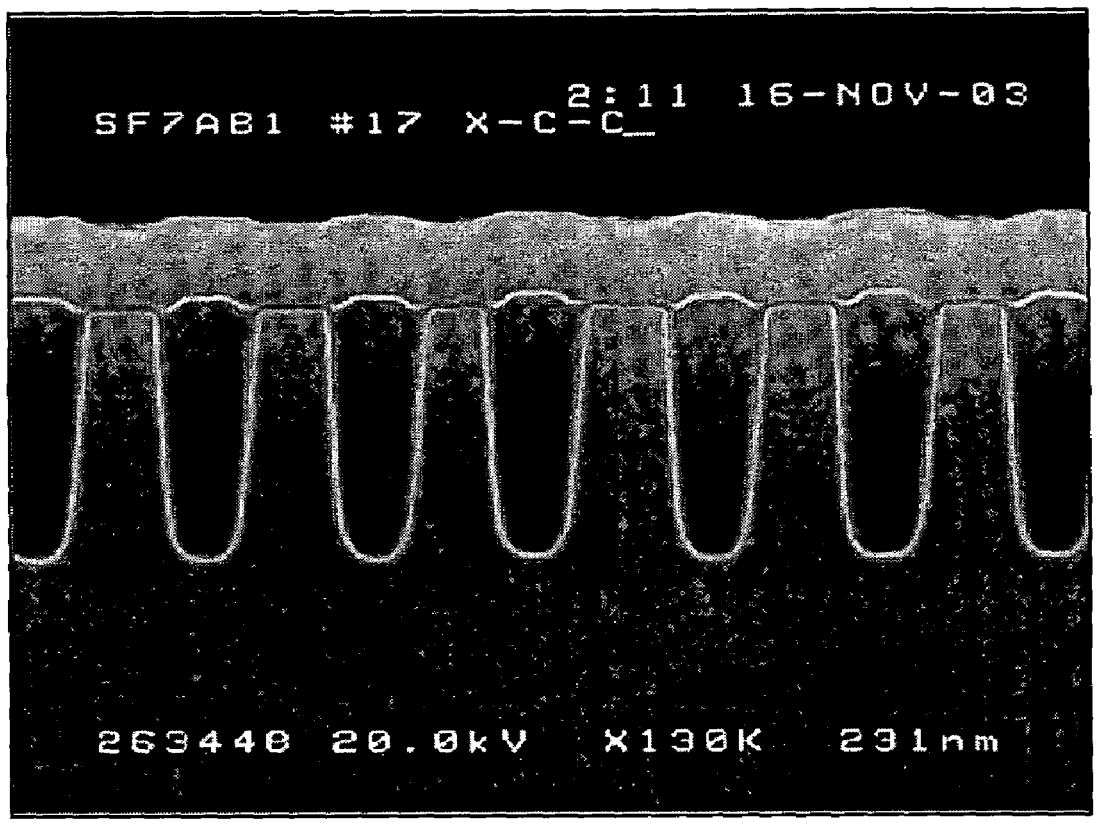
FIG. 14 is a scanning electron microscope (SEM) picture illustrating a cross sectional surface of a device isolation layer formed in accordance with some embodiments of the invention.
Figure 15:
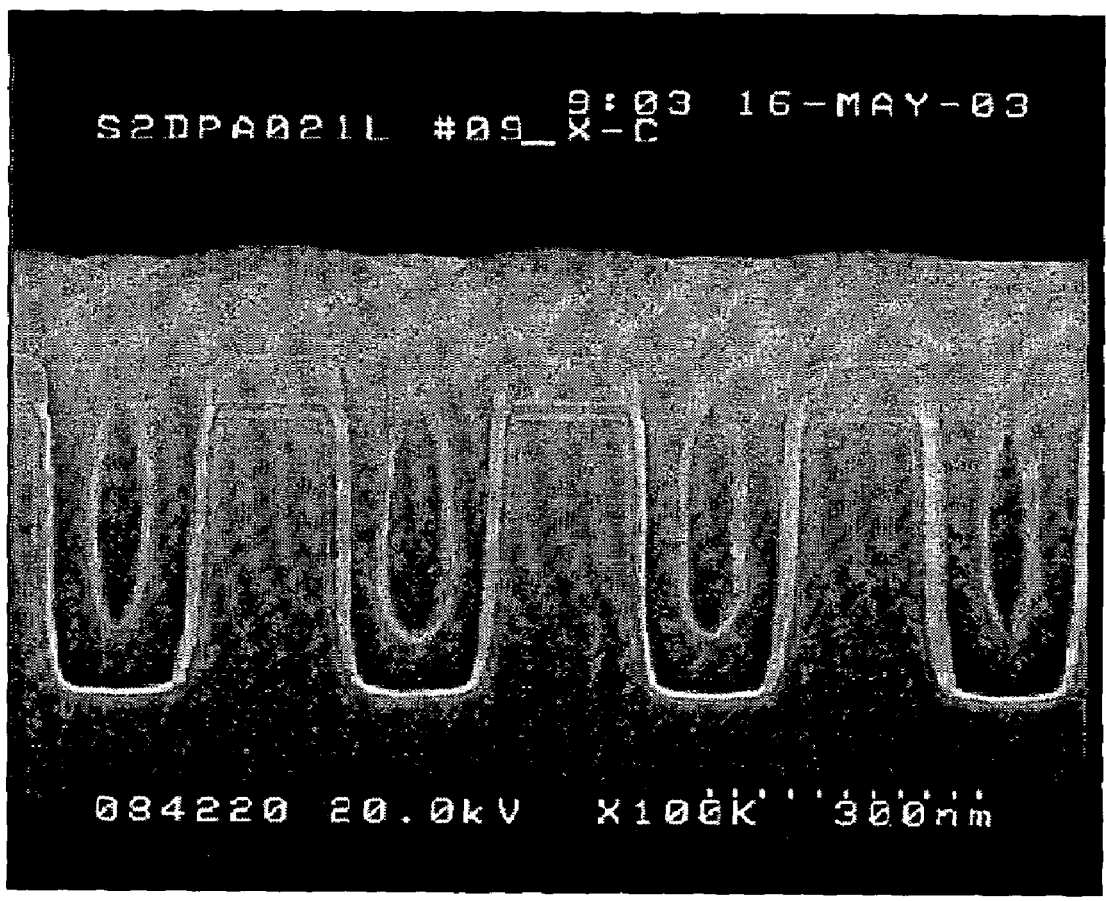
FIG. 15 is a SEM picture illustrating a cross sectional surface of a device isolation layer formed by a conventional CVD process using tetraethyl orthosilicate (TEOS) gas.

FIG. 14 is a scanning electron microscope (SEM) micrograph illustrating a cross sectional surface of a device isolation layer formed in accordance with the embodiments of FIGS. 10A-10D. FIG. 15 is a SEM micrograph illustrating a cross sectional surface of a device isolation layer formed by a conventional CVD process using TEOS gas. As illustrated in FIG. 14, a device isolation layer formed in accordance with embodiments of the present invention may sufficiently fill a trench without apparent formulation of voids and/or seams. In contrast, a conventional device isolation layer may insufficiently fill the trench, so that a plurality of voids and/or seams are observed. A comparison of FIG. 14 and FIG. 15 indicates that a multilayer structure including at least two thin layers formed in accordance with some embodiments of the present invention may sufficiently fill a recessed portion such as a trench and/or an opening on a semiconductor substrate with reduced voids and/or seams.

Reflectivity of a Device Isolation Layer

A measurement of the reflectivity of a device isolation layer shows that the reflectivity of a device isolation layer formed in accordance with some of the embodiments of the present invention was about 1.44, and the reflectivity of a conventional device isolation layer was about 1.43. This observation indicates that the formation of a multilayer structure in accordance with embodiments of FIGS. 10A-10D has little effect on the reflectivity of the device isolation layer.

Etching Rate of a Device Isolation Layer

An etching process was performed on a conventional device isolation layer and a sample device isolation layer formed by a process in accordance with the embodiments of FIGS. 10A-10D using an aqueous HF solution (about 0.5% in water) as an etchant. While the sample device isolation layer was etched at a rate of about 80 Å/min, the conventional device isolation layer was etched at a rate of about 190 Å/min. This observation indicates that control of an etching process may be improved in a device isolation layer according to some embodiments of the present invention than in a conventional device isolation layer.

Thermal Reduction Rate of a Device Isolation Layer

A thermal reduction rate was measured in regard to a conventional device isolation layer and a sample device isolation layer formed in accordance with the embodiments of FIGS. 10A-10D. A sample structure including a sample device isolation layer of the present invention and a conventional structure including the conventional device isolation layer was heated to a temperature of about 900° C. While the sample device isolation layer had a thermal reduction rate of about 2.2%, the conventional device isolation layer had a thermal reduction rate of about 4.6%. Thus, a device isolation layer in accordance with some embodiments of the present invention may have a superior thermal resistance compared to a conventional device isolation layer.

According to some embodiments of the present invention, a multilayer structure may be formed in a recessed portion of a semiconductor substrate with reduced deposition defects such as voids and/or seams by repeating a step of forming a thin layer several times, thereby forming a semiconductor device having a fine pattern with reduced deposition defects.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of manufacturing a semiconductor device comprising:
   providing a first structure having a recess therein in a deposition chamber, the recess having an aspect ratio of about three or more;
   flowing a first reactant and a second reactant over the first structure for a first deposition period at respective first and second flow rates to thereby deposit a first thin layer of a material in the recess;
   substantially reducing the flow rates of the first reactant and the second reactant to the first structure for a pause period; and
   flowing the first reactant and the second reactant over the first structure for a second deposition period at respective third and fourth flow rate to thereby deposit a second thin layer of a material.

2. The method of claim 1, wherein the first reactant is provided at a flow rate of between about 100 sccm and about 3000 sccm and the second reactant is provided at a flow rate of about 6000 sccm to about 20,000 sccm.

3. The method of claim 1, wherein the first reactant and the second reactant are provided in the deposition chamber for a time of about 200 seconds to about 250 seconds.

4. The method of claim 1, wherein substantially reducing the flow of the first and second reactants comprises stopping the flow of the first and second reactants.

5. The method of claim 1, wherein flowing the first and second reactants comprises depositing a thin layer, the method further comprising repeating the steps of depositing a thin layer and substantially reducing the flow of the first and second reactants at least twice.

6. The method of claim 5, wherein the flow rate of the first reactant is increased during at least one deposition step, and the flow rate of the second reactant is substantially constant during the at least one deposition step.

7. The method of claim 6, wherein the flow rate of the first reactant is increased during the at least one deposition step at a rate of about 2 sccm/sec to about 50 sccm/sec.

8. The method of claim 6, wherein the flow rate of the second reactant during the deposition step is greater than a maximum flow of the first reactant during the deposition step.

9. The method of claim 5, wherein the flow rate of the first reactant is constant during a first deposition step, and the flow rate of the first reactant is increased at a subsequent deposition step such that a total volume of the first reactant is increased in the subsequent deposition step, and the flow rate of the second reactant is constant in each of the first deposition step and the subsequent deposition step.

10. The method of claim 5, further comprising:
   supplying a purge gas into the deposition chamber after a deposition step; and
   pumping the purge gas out of the deposition chamber.

11. The method of claim 10, wherein the purge gas comprises an inert gas.

12. The method of claim 10, wherein the purge gas is provided for a time of about 12 seconds to about 20 seconds.

13. The method of claim 1, wherein flowing the first reactant and the second reactant is performed at a temperature of about 400° C. to about 550° C. and at a pressure of about 200 Torr to about 760 Torr, 14. The method of claim 1, wherein the first reactant includes a silicon source material and the second reactant includes an oxidizing agent.

15. The method of claim 14, wherein the silicon source material comprises $Si(OC_2H_5)_4$, $SiH_2Cl_2$, $SiCl_3SiCl_3$ and/or $SiR_4$ where R in includes one of —H, —OCH$_3$, —OCH$_2$CH$_2$ and/or —O(CH$_2$)$_n$CH$_3$ ($2 \leq n \leq 20$), and the oxidizing agent comprises $O_3$, $O_2$, $H_2O$ and/or $H_2O_2$.

16. The method of claim 1, wherein the recess includes a trench, an opening between gate patterns and/or an opening between sacrificial layer patterns for a node separation of a lower electrode of a cylindrical capacitor.

17. The method of claim 1, wherein a bottom layer of the multilayer structure is conformally formed on a bottom surface and a side surface of the recess.

18. A method of forming a trench isolation layer for a semiconductor device, comprising:
   forming a trench having an aspect ratio of about three or more in a semiconductor substrate;
   placing the semiconductor substrate in a deposition chamber;
   providing a flow of first and second reactants onto the substrate for a predetermined deposition period, thereby conformally forming a first thin layer on a bottom surface and a side surface of the trench;
   stopping the flow of the first and second reactants from being provided onto the substrate for a predetermined pause period;
   repeating a sequence of providing a flow of the first and second reactants for a predetermined deposition period and stopping the flow of the first and second reactants for a predetermined pause period until the trench is filled up, thereby forming a multilayer structure in the trench.

19. The method of claim 18, wherein providing a flow of first and second reactants onto the substrate for a predetermined deposition period comprises a deposition step and wherein the flow rate of the first reactant is increased during at least one deposition step, and the flow rate of the second reactant is substantially constant during the at least one deposition step.

20. The method of claim 19, wherein the flow rate of the second reactant during the deposition step is greater than a maximum flow of the first reactant during the deposition step.

21. The method of claim 18, wherein providing a flow of first and second reactants onto the substrate for a predetermined deposition period comprises a deposition step, and wherein the flow rate of the first reactant is constant during a first deposition step, and the flow rate of the first reactant is increased at a subsequent deposition step such that a total volume of the first reactant is increased in the subsequent deposition step, and the flow rate of the second reactant is constant in each of the first deposition step and the subsequent deposition step.

22. The method of claim 18, further comprising:
   supplying a purge gas into the deposition chamber after a deposition step; and
   pumping the purge gas out of the chamber.

23. The method of claim 22, wherein the purge gas comprises an inert gas.

24. The method of claim 18, wherein providing a flow of first and second reactants onto the substrate is performed at a temperature of about 400° C. to about 550° C. and at a pressure of about 200 Torr to about 760 Torr.

25. The method of claim 18, wherein the first reactant includes a silicon source material and the second reactant includes an oxidizing agent.

26. The method of claim 25, wherein the silicon source material comprises $Si(OC_2H_5)_4$, $SiH_2Cl_2$, $SiCl_3SiCl_3$ and/or $SiR_4$ where R in includes one of —H, —OCH$_3$, —OCH$_2$CH$_2$ and/or —O(CH$_2$)nCH$_3$(2≦n≦20), and the oxidizing agent comprises O$_3$, O$_2$, H$_2$O and/or H$_2$O$_2$.

27. The method of claim 18, further comprising removing upper portions of the multilayer structure until a top portion of the trench is exposed.

28. The method of claim 27, wherein the multilayer structure is at least partially removed by a chemical mechanical polishing (CMP) process.

* * * * *